United States Patent [19]

Shyu

[11] Patent Number: 5,332,935
[45] Date of Patent: Jul. 26, 1994

[54] ECL AND TTL TO CMOS LOGIC CONVERTER

[75] Inventor: Jyn-Bang Shyu, Cupertino, Calif.

[73] Assignee: Sierra Semiconductor, Calif.

[21] Appl. No.: 45,101

[22] Filed: Apr. 12, 1993

[51] Int. Cl.[5] .......................................... H03K 19/094
[52] U.S. Cl. ................................... 307/475; 307/443; 307/451
[58] Field of Search ............... 307/443, 448, 451, 475, 307/360, 494

[56] References Cited

U.S. PATENT DOCUMENTS

| | | | |
|---|---|---|---|
| 4,472,647 | 9/1984 | Allgood et al. | 307/360 X |
| 4,527,079 | 7/1985 | Thompson | 307/475 |
| 4,625,129 | 11/1986 | Ueno | 307/443 X |
| 4,975,602 | 12/1990 | Nhu | 307/475 |
| 5,034,634 | 7/1991 | Yamamoto | 307/475 X |
| 5,166,558 | 11/1992 | Ohsawa | 307/443 X |
| 5,260,612 | 11/1993 | Lehmann et al. | 307/475 |

OTHER PUBLICATIONS

Steyaert, M., et al. "A High-Dynamic-Range CMOS Op Amp with Low-Distortion Output Structure", IEEE Journal of Solid-State Circuits, SC-22, 6:1204–1207, Dec. 1987.

Primary Examiner—David R. Hudspeth
Attorney, Agent, or Firm—Burns, Doane, Swecker & Mathis

[57] ABSTRACT

A logic converter enables a digital logic product to work with either an ECL signal input or a TTL signal input without any need of modifying or reconfiguring the product. In particular, the logic converter converts digital input signals of a first logic type (for example, ECL) to digital output signals of a third logic type (for example, CMOS). It also converts digital input signals of a second logic type (for example, TTL) to digital output signals of the third logic type. A first operational transconductance amplifier circuit including a first differential amplifier using a differential transistor pair of a first conduction type receives digital input signals of the first logic type and converts the digital input signals to digital output signals of the third logic type. A second operational transconductance amplifier circuit including a second differential amplifier using a differential transistor pair of a second conduction type receives digital input signals of the second logic type and converts the digital input signals to digital output signals of the third logic type. Circuitry causes only one of the first differential amplifier and the second differential amplifier to be active at a time depending on which logic type of digital input signal is being received. The circuitry for causing only one differential amplifier to be active includes a first level shifting circuit connected to the first differential amplifier and a second level shifter circuit connected to the second differential amplifier.

7 Claims, 2 Drawing Sheets

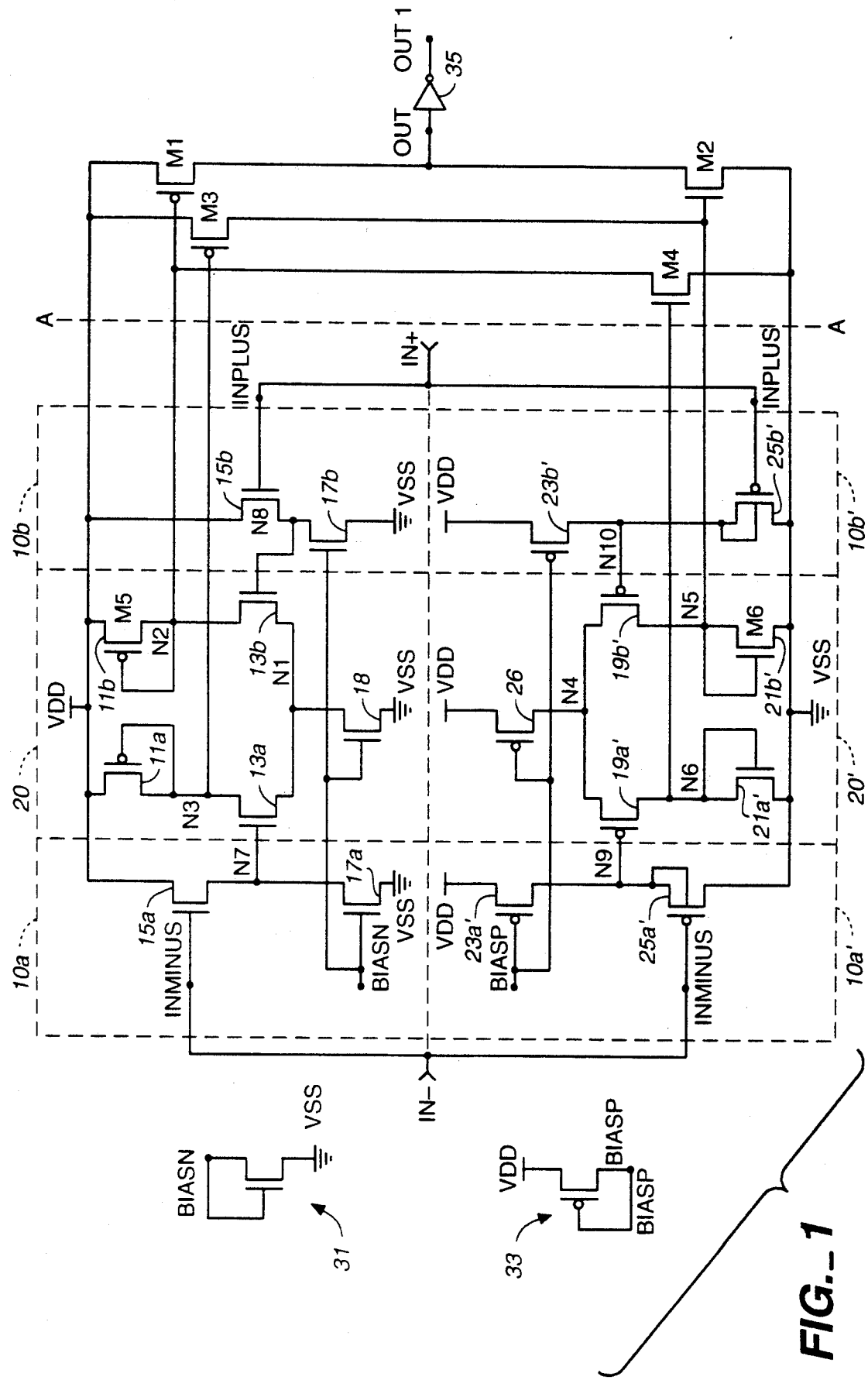
FIG._1

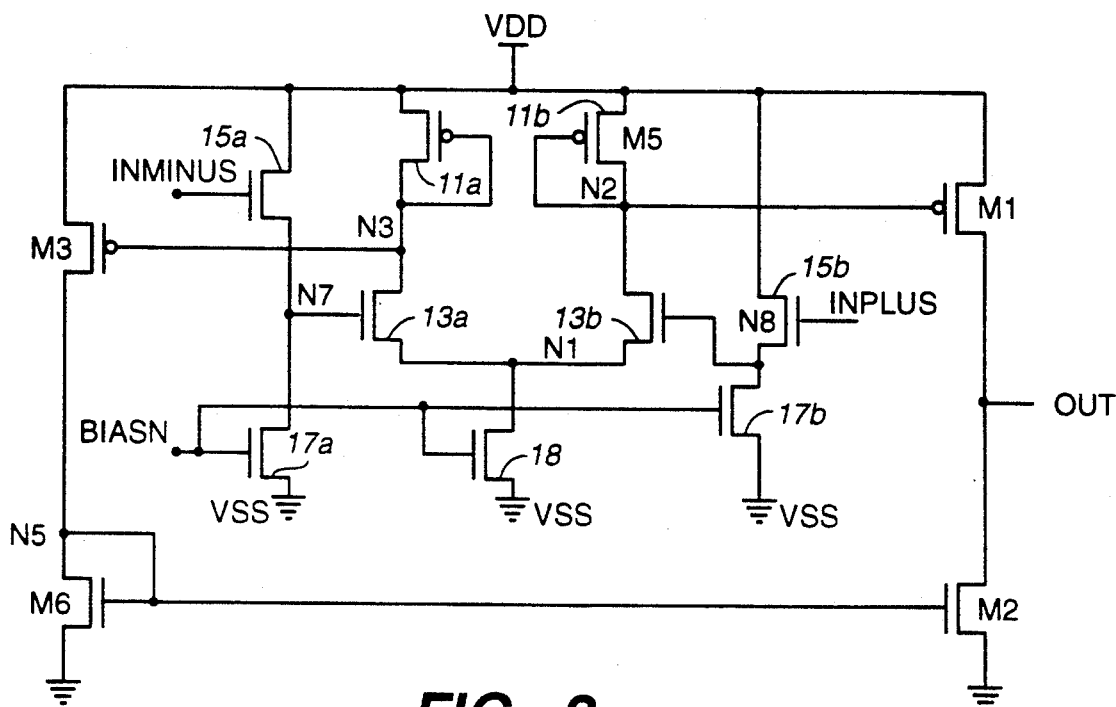
FIG._2
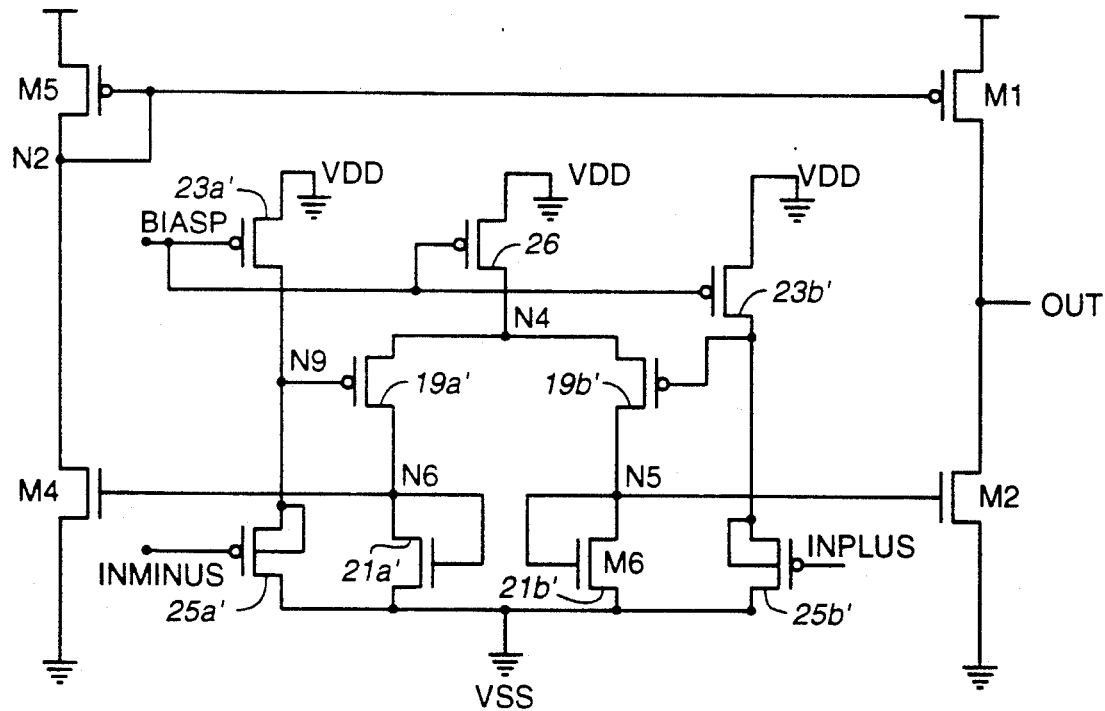
FIG._3

ECL AND TTL TO CMOS LOGIC CONVERTER

BACKGROUND OF THE INVENTION

1. Field of the Invention

The present invention relates to logic converters, i.e., circuits for converting digital input signals of one logic type to digital output signals of another logic type. In particular, the invention relates CMOS logic converters for converting digital input signals to CMOS digital output signals.

2. State of the Art

A number of integrated circuit technologies, or logic families, have been developed, each having its own characteristics in terms of speed and power. Emitter-Coupled Logic (ECL) is the fastest logic commercially available in silicon. The speed of ECL is obtained at the price of high power dissipation. Nevertheless, where high-speed computation is a necessity, ECL may be used to advantage. Complimentary Metal Oxide Semiconductor (CMOS) technology, on the other hand, exhibits very low power dissipation but only moderate speed. CMOS also allows high integration densities to be achieved, making it the preferred technology for Very Large Scale Integration (VLSI). Transistor Transistor Logic (TTL) falls in between ECL and CMOS in terms of speed and power. By changing the values of resistors, a trade off between speed and power may be made.

Logic converters are used to enable integrated circuits of different logic families to be used together. Logic converters are known that convert ECL signals to CMOS signals, as are logic converters that convert TTL signals to CMOS signals. Such logic converters have been embodied in separate parts. Stocking separate parts increases inventory costs.

A need therefore exists for a logic converter to enable a product to work with either an ECL signal input or a TTL signal input without the need of modifying the product or of reconfiguring the product in any way. Such a product could be incorporated in either a high-speed high-performance system (i.e., ECL logic) or a lower-speed lower-cost system (i.e., TTL logic), according to the choice of the user.

SUMMARY OF THE INVENTION

Generally speaking, the logic converter of the present invention enables a digital logic product to work with either an ECL signal input or a TTL signal input without any need of modifying or reconfiguring the product. In particular, the logic converter converts digital input signals of a first logic type (for example, ECL) to digital output signals of a third logic type (for example, CMOS). It also converts digital input signals of a second logic type (for example, TTL) to digital output signals of the third logic type. A first operational transconductance amplifier circuit including a first differential amplifier using a differential transistor pair of a first conduction type receives digital input signals of the first logic type and converts the digital input signals to digital output signals of the third logic type. A second operational transconductance amplifier circuit including a second differential amplifier using a differential transistor pair of a second conduction type receives digital input signals of the second logic type and converts the digital input signals to digital output signals of the third logic type. Circuitry causes only one of the first differential amplifier and the second differential amplifier to be active at a time depending on which logic type of digital input signal is being received. The circuitry for causing only one differential amplifier to be active includes a first level shifting circuit connected to the first differential amplifier and a second level shifter circuit connected to the second differential amplifier.

BRIEF DESCRIPTION OF THE DRAWINGS

The present invention may be further understood from the following description in conjunction with the appended drawings. In the drawings:

FIG. 1 is schematic diagram of the logic converter circuit of the present invention;

FIG. 2 is a schematic diagram of a portion of the circuit of FIG. 1 that is active when ECL level inputs are applied to the circuit;

FIG. 3 is a schematic diagram of a portion of the circuit of FIG. 1 that is active when TTL level inputs are applied to the circuit.

DETAILED DESCRIPTION OF THE PREFERRED EMBODIMENT

The traditional incompatibility of TTL and ECL devices is due not only to different logic levels for the two kinds of signals but also different signal types. TTL signals are single-ended with a positive voltage threshold of about 2 V and a negative voltage threshold of about 0.8 V. ECL signals, on the other hand, occur as a ± signal pair (i.e., are double-ended) with a positive voltage threshold of about −0.9 V and a negative voltage threshold of about −1.8 V. To simplify power requirements, the present TTL/ECL compatible logic converter is designed to accommodate modified ECL inputs having a high voltage threshold and a low voltage threshold that are both positive. For example, the high voltage threshold of the modified ECL signals might be 4.0 V, and the low voltage threshold might be 3.4 V. That is, when the "+" input of a ECL input pair has a voltage level greater than or equal to 4.0 V, and the "−" input of the ECL input pair has a voltage level less than or equal to 3.4 V, the ECL input pair represents a logic "1". Conversely, when the "+" input is less that or equal to 3.4 V and the "−" input is greater than or equal to 4.0 V, the input pair represents a logic "zero". Modified ECL inputs may be produced from standard ECL inputs by simple level shifting.

The common mode voltage of an input signal may be thought of as DC average of that signal. For the TTL logic levels previously specified, the common mode voltage is 1.4 V. For the modified ECL logic levels specified, the common mode voltage is 3.7 V.

In general, the present logic converter achieves compatibility with both TTL and modified ECL inputs by using dual differential input amplifiers having rail-to-rail common mode inputs. One differential amplifier uses an n-channel differential transistor pair to provide for the common mode input range from $2 V_{Tn}$ to $V_{DD}$ where $V_{Tn}$ is the n-channel threshold voltage. This range covers the ECL logic common mode range, i.e. $V_{DD} - 1.3 V \pm 300$ mV. The other differential amplifier uses a p-channel differential transistor pair to provide for the common mode input range from $V_{SS}$ to $V_{DD} - 2 V_{Tp}$ where $V_{Tp}$ is the absolute p-channel threshold voltage. This range covers the TTL logic common mode range, i.e. $1.4 V \pm 600$ mV.

Each differential pair is provided with its own input level shifters to ensure that the differential inputs (namely nodes N7, N8, N9 and N10 in FIG. 1) attain proper common mode voltages to bias one of the differential amplifiers into its active region and the other of the differential amplifiers into its cutoff region. Operation of the one differential amplifier in its active region provides the highest voltage gain for amplifying the low level input signals to produce CMOS output signals exhibiting a relatively large output swing. Operation of the other differential amplifier in its cutoff region eliminates a potential slow signal path, thereby boosting the timing response of the converter.

When ECL signals are input to the logic converter, the p-channel differential pair is shut off. The n-channel differential pair operates in conjunction with additional transistors to form a conventional differential transconductance amplifier. When a signal pair composed of a TTL signal and a fixed voltage input (for example 1.4 V, the TTL common mode voltage) is input to the circuit, the n-channel differential pair is shut off. The p-channel differential pair operates in cooperation with additional transistors to form a conventional differential transconductance amplifier. The differential signals produced by the differential transconductance amplifier in each of the two modes of operation are converted into a single-ended rail-to-rail CMOS output signal. This double-ended to single-ended conversion is performed by transistors M1–M4 in FIG. 1.

With the foregoing introduction, the circuit of FIG. 1 may be more readily understood. Whereas the portion of the circuit to the right of dashed line A in FIG. 1 is asymmetrical, the portion of the circuit on the left hand of line A exhibits almost perfect bilateral symmetry. Elements that mirror one another about a vertical axis of reflection are designated by the same reference numeral followed by the lower case letters "a" and "b", respectively, whereas elements that mirror one another about a horizontal axis of reflection are differentiated by the use of a prime designation after the reference number of the element in the lower half of the figure. For convenience, transistors 11b and 21b' have also been given the designations M5 and M6, respectively.

Referring to FIG. 1, an n-type differential amplifier 20 includes an n-type differential transistor pair, transistors 13a and 13b, each connected through a respective load device formed by p-type transistor 11a and p-type transistor 11b to a digital voltage source VDD, which may be approximately 5 V. The source electrodes of the differential transistor pair are connected in common at node N1, which is connected through n-type transistor 18 to digital ground VSS, thereby forming the "tail" of the differential transistor pair. The differential input to the differential transistor pair is applied at nodes N7 and N8.

Level shifting circuits 10a and 10b are connected to respective transistors of the differential transistor pair. Each of the level shifting circuits consists of two series-connected n-type transistors (15a, 17a; 15b, 17b). The gate electrodes of the transistors 15a and 15b are connected to different ones of the differential input signal pair (IN+, IN−). The gate electrodes of the transistors 17a and 17b, as well as the gate electrode of transistor 18, are connected to an n-transistor bias current source 31.

A p-type differential amplifier 20' includes a p-type differential transistor pair, transistors 19a' and 19b', each connected through a respective load device formed by n-type transistor 21a' and p-type transistor 21b' to a digital voltage source VSS, which may be approximately 0 V. The source electrodes of the differential transistor pair are connected in common at node N4, which is connected through p-type transistor 26 to digital power VDD, thereby forming the "tail" of the differential transistor pair. The differential input to the differential transistor pair is applied at nodes N9 and N10.

Level shifting circuits 10a' and 10b' are connected to respective transistors of the differential transistor pair. Each of the level shifting circuits consists of two series-connected p-type transistors (23a', 25a'; 23b', 25b'). The gate electrodes of the transistors 23a' and 23b' are connected to different ones of the differential input signal pair (IN+, IN−). The gate electrodes of the transistors 25a' and 25b', as well as the gate electrode of transistor 26, are connected to a p-transistor bias current source 33.

Key components in the circuit of FIG. 1 are transistors M1–M4, which convert the differential output signals produced at nodes N2 and N3 and nodes N5 and N6, respectively, into a single-ended rail-to-rail output signal out. Transistors M1–M4 are arranged in an inverting configuration. An invertor 35 is therefore used to produce the final output signal OUT1.

In operation, the level shifting circuits 10a, 10b, 10a' and 10b' ensure that only one of the differential amplifiers 20 and 20' is turned on at a time depending on the differential input signals to the circuit. When modified ECL signals are input to the circuit, the p-channel differential pair 20' is shut off (i.e., zero current flows through node N4). The n-channel differential pair 20 works with transistors M1–M3 and M6 to form a conventional differential transconductance amplifier. Note in this regard that the gate electrode of transistor M6 is connected at node N5 to the source electrode of transistor M3, allowing transistor M6 to be "borrowed" from the differential amplifier 20' when the differential amplifier is inactive. The resulting differential transconductance amplifier is shown in FIG. 2, in which only essential elements have been illustrated.

When a TTL signal is input to the circuit with one input biased at 1.4 V (the TTL common mode voltage), the n-channel differential pair 20 is shut off (i.e., zero current flows through node N1). The p-channel differential pair 20' works with transistors M1, M2, M4 and M5 to form a conventional differential transconductance amplifier. The gate electrode of transistor M5 is connected at node N2 to the drain electrode of transistor M4, allowing it to be borrowed from the inactive differential amplifier 20. The resulting differential transconductance amplifier is shown in FIG. 3.

The level converter circuit of FIG. 1 therefore performs both ECL to CMOS logic conversion and TTL to CMOS conversion without requiring any modification or any logic select input signal. The user may therefore incorporate the identical circuit into either a high-speed high-performance system (for example 120 MHz) or a low-speed low-cost system (for example 60 MHz).

The foregoing has described that principles, preferred embodiments and modes of operation of the present invention. However, the invention should not be construed as limited to the particular embodiments discussed. Instead, the above described embodiments should be regarded as illustrative rather than restrictive, and it should be appreciated that variations may be made in those embodiments by workers skilled in the art without departing from the scope of the present invention as described by the following claims.

What is claimed:

1. Apparatus for converting digital input signals of a first logic type to digital output signals of a third logic type and also for converting digital input signals of a second logic type to digital output signals of said third logic type, comprising:

first operational transconductance amplifier means, including a first differential amplifier using a differential transistor pair of a first conduction type, for receiving digital input signals of said first logic type and converting the digital input signals to digital output signals of said third logic type;

second operational transconductance amplifier means, including a second differential amplifier using a differential transistor pair of a second conduction type, for receiving digital input signals of said second logic type and converting the digital input signals to digital output signals of said third logic type; and means for causing only one of said first differential amplifier and said second differential amplifier to be active at a time depending on which logic type of digital input signals is being received.

2. The apparatus of claim 1 wherein said means for causing only one differential amplifier to be active comprises first level-shifting means connected to said first differential amplifier and second level-shifting means connected to said second differential amplifier.

3. The apparatus of claim 2 wherein said third logic type is CMOS.

4. The apparatus of claim 3 wherein said first logic type is modified ECL.

5. The apparatus of claim 3 wherein said second logic type is TTL.

6. The apparatus of claim 5 wherein said digital input signals of said second logic type comprise a signal pair, one signal of the signal pair being a standard TTL signal and another signal of the signal pair being a constant-level D.C. signal.

7. The apparatus of claim 6 wherein the constant-level D.C. signal is a TTL common mode voltage.

* * * * *